United States Patent
Misawa et al.

(10) Patent No.: US 9,240,286 B2
(45) Date of Patent: Jan. 19, 2016

(54) PHOTOELECTRIC CONVERSION DEVICE, LIGHT DETECTING DEVICE, AND LIGHT DETECTING METHOD

(75) Inventors: Hiroaki Misawa, Sapporo (JP); Yoshiaki Nishijima, Sapporo (JP); Kosei Ueno, Sapporo (JP); Kei Murakoshi, Sapporo (JP)

(73) Assignee: NATIONAL UNIVERSITY CORPORATION HOKKAIDO UNIVERSITY, Sapporo-shi (JP)

( * ) Notice: Subject to any disclaimer, the term of this patent is extended or adjusted under 35 U.S.C. 154(b) by 321 days.

(21) Appl. No.: 13/394,528

(22) PCT Filed: Sep. 2, 2010

(86) PCT No.: PCT/JP2010/065052
§ 371 (c)(1),
(2), (4) Date: May 21, 2012

(87) PCT Pub. No.: WO2011/027830
PCT Pub. Date: Mar. 10, 2011

(65) Prior Publication Data
US 2012/0325301 A1 Dec. 27, 2012

(30) Foreign Application Priority Data

Sep. 7, 2009 (JP) .............................. P2009-205959
Mar. 10, 2010 (JP) .............................. P2010-053093

(51) Int. Cl.
*H01L 31/0224* (2006.01)
*H01L 31/04* (2014.01)
(Continued)

(52) U.S. Cl.
CPC ........... *H01G 9/2031* (2013.01); *H01G 9/2022* (2013.01); *H01L 29/47* (2013.01); *H01L 31/022425* (2013.01); *H01L 31/18* (2013.01); *Y02E 10/542* (2013.01)

(58) Field of Classification Search
CPC .. H01G 9/2031; H01G 9/2022; H01L 27/115; H01L 27/11556; H01L 29/47; H01L 29/51; H01L 29/511; H01L 21/28273; H01L 31/18; H01L 31/022425; H01L 51/441; Y02E 10/50; Y02E 10/542; Y02E 10/549

USPC ................................ 136/249, 252, 257, 263
See application file for complete search history.

(56) References Cited

U.S. PATENT DOCUMENTS 5,685,919 A    11/1997   Saito et al.
6,127,624 A * 10/2000   Ishida et al. .................. 136/257
(Continued)

FOREIGN PATENT DOCUMENTS

JP      8-264821 A    10/1996
JP    10-340742 A    12/1998
(Continued)

OTHER PUBLICATIONS

Y.H. Su, W.H. Lai, I.G. Teoh, M.H. Hon, J.L. Huang, "Layer-by-layer Au nanoparticles as a Schottky barrier in a water-based dye-sensitized solar cell" (2007), pp. 173-178.*
(Continued)

*Primary Examiner* — Jayne Mershon
*Assistant Examiner* — Mayla Gonzalez Ramos
(74) *Attorney, Agent, or Firm* — Sughrue Mion, PLLC

(57) ABSTRACT

The present invention has an object to provide a photoelectric conversion device which can be manufactured through a simple manufacturing process, achieve photoelectric conversion over a wide range of wavelength regions, and attain high photoelectric conversion efficiency even in the infrared wavelength region, a photodetection device, and a photodetection method. This photoelectric conversion device 1 includes a substrate 2 containing single crystalline titanium dioxide, adhesion layers 2c formed on a surface 2a of the substrate 2, metal microstructure bodies 3, each of which has a volume of 1,000 nm$^3$ or more and 3,000,000 nm$^3$ or less, arranged at predetermined intervals in a predetermined direction on surfaces of the adhesion layers 2c, a container 4 for containing an electrolyte solution L in an arrangement region of the metal microstructure bodies 3 on the surface 2a of the substrate 2, a conductive layer 7 formed on a rear surface 2b of the substrate 2, and a counter electrode 5 in contact with the electrolyte solution L in the container 4; and the metal microstructure bodies 3 adhere onto the substrate 2 through the adhesion layers 2c, a Schottky barrier is formed at an interface of the substrate 2 with the metal microstructure bodies 3, and photoelectric conversion is carried out for light in an infrared region by utilizing a plasmon resonance phenomenon.

8 Claims, 18 Drawing Sheets

(51) Int. Cl.
  *H01L 31/18* (2006.01)
  *H01L 51/44* (2006.01)
  *H01L 29/47* (2006.01)
  *H01G 9/20* (2006.01)

(56) References Cited

U.S. PATENT DOCUMENTS

| | | | |
|---|---|---|---|
| 7,776,425 B2* | 8/2010 | Kalkan et al. | 428/210 |
| 2003/0107741 A1* | 6/2003 | Pyo et al. | 356/445 |
| 2006/0065300 A1 | 3/2006 | Enomoto et al. | |
| 2011/0274913 A1* | 11/2011 | Lin et al. | 428/323 |

FOREIGN PATENT DOCUMENTS

| | | |
|---|---|---|
| JP | 2001-035551 A | 2/2001 |
| JP | 2002-231324 A | 8/2002 |
| JP | 2004-103521 A | 4/2004 |
| JP | 2007-073794 A | 3/2007 |
| JP | 2009-070768 A | 4/2009 |

OTHER PUBLICATIONS

D. Derkacs, S. H. Lim, P. Matheu, W. Mar, and E. T. Yu, "Improved performance of amorphous silicon solar cells via scattering from surface plasmon polaritons in nearby metallic nanoparticles", (2006).*

Teruhisa Ohno, Koji Sarukawa, Kojiro Tokieda, and Michio Matsumura, "Morphology of a TiO2 Photocatalyst (Degussa, P-25) Consisting of Anatase and Rutile Crystalline Phases", 2001, p. 82.*

Emiko Kazuma, Kazuki Matsubara, K. Lance Kelly, Nobuyuki Sakai, and Tetsu Tatsuma, "Bi- and Uniaxially Oriented Growth and Plasmon Resonance Properties of Anisotropic Ag Nanoparticles on Single Crystalline TiO2 Surfaces", published Feb. 18, 2009, pp. 4758-4762.*

Yu, Jiaguo, et al., "Fabrication and Characterization of Visible-Light-Driven Plasmonic Photocatalyst Ag/AgCl/TiO$_2$ Nanotube Arrays", Journal of Phys. Chem. C, 2009, pp. 16394-16401, vol. 133, No. 37.

Wang, Ping, et al., "Synthesis and Plasmon-Induced Charge-Transfer Properties of Monodisperse Gold-Doped Titania Microspheres", Chemistry a European Journal, 2009, pp. 4366-4372, vol. 15.

Su, Y. H., et al., "Layer-by-layer Au nanoparticles as a Schottky barrier in a water-based dye-sensitized solar cell", Applied Physics A, Materials Science & Processing, 2007, pp. 173-178, vol. 88.

Akiyama, Tsuyoshi, et al., "Enormous enhancement in photocurrent generation using electrochemically fabricated gold nanostructures", Chem. Commun., 2010, pp. 306-308, vol. 46.

Standridge, Stacey D., et al., "Distance Dependence of Plasmon-Enhanced Photocurrent in Dye-Sensitized Solar Cells", Journal of the American Chemical Society, 2009, pp. 8407-8409, vol. 131, No. 24.

Franken, R. H., et al., "Understanding light trapping by light scattering textured back electrodes in thin film nip-type silicon solar cells", Journal of Applied Physics, 2007, pp. 014503-1-014503-7, vol. 102, No. 014503.

Mendes, Manuel J., et al., "Plasmonic light enhancement in the near-field of metallic nanospheroids for application in intermediate band solar cells", 2009, pp. 071105-1-071105-3, vol. 95, No. 071105.

Akimov, Yu. A., "Enhancement of optical absorption in thin-film solar cells through the excitation of higher-order nanoparticle plasmon modes", Optics Express, Jun. 8, 2009, pp. 10195-10205, vol. 17, No. 12.

Tian, Yang, et al., "Mechanisms and Applications of Plasmon-Induced Charge Separation at TiO$_2$ Films Loaded with Gold Nanoparticles", Journal of American Chemical Society, 2005, pp. 7632-7637, vol. 127, No. 20.

* cited by examiner

Fig.2
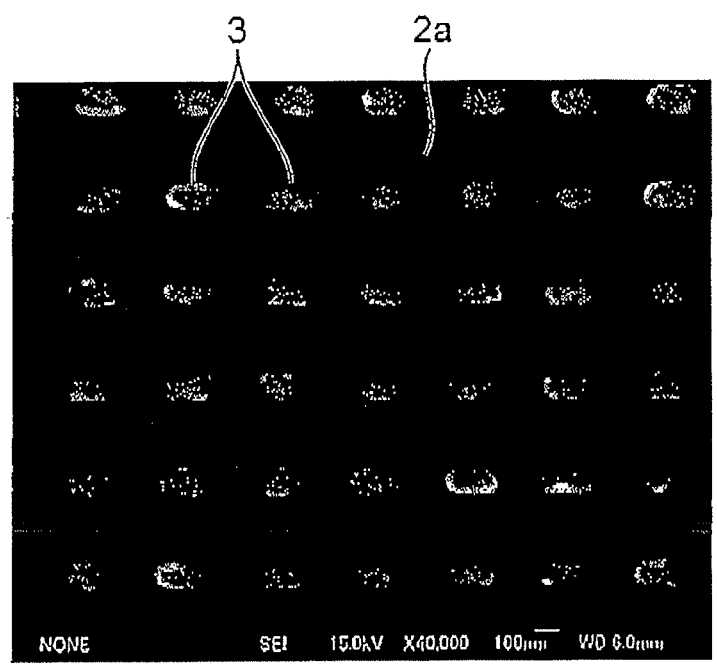
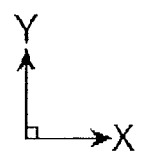

Fig.7
(a)
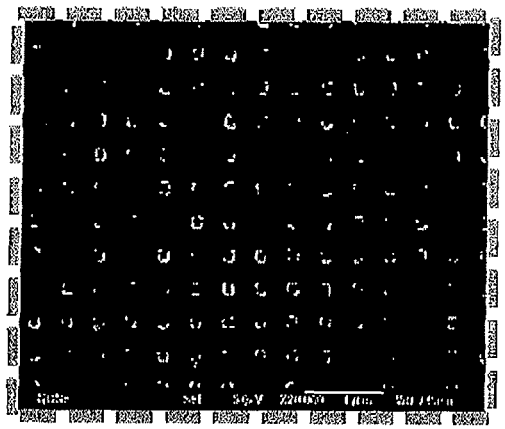
(b)
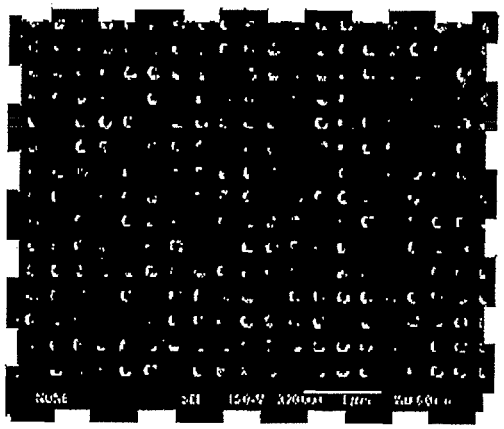
(c)
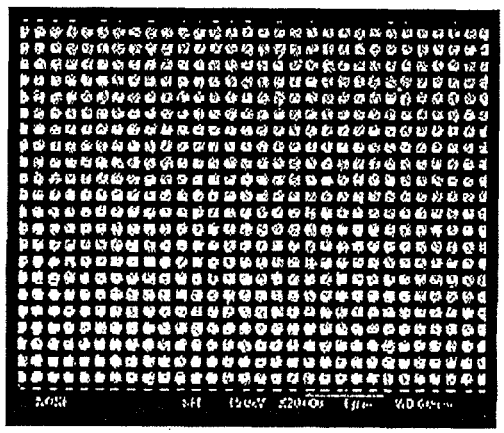

*Fig.12*
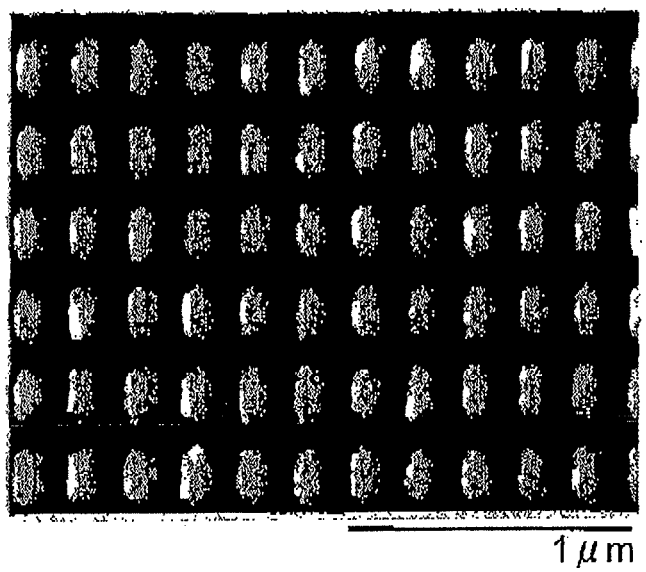
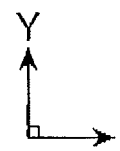

PHOTOELECTRIC CONVERSION DEVICE, LIGHT DETECTING DEVICE, AND LIGHT DETECTING METHOD

CROSS REFERENCE TO RELATED APPLICATIONS

This application is a National Stage of International Application No. PCT/JP2010/065052 filed Sep. 2, 2010, claiming priority based Japanese Patent Application Nos. 2009-205959, filed Sep. 7, 2009, and 2010-053093, filed Mar. 10, 2010, the contents of all of which are incorporated herein by reference in their entirety.

TECHNICAL FIELD

The present invention relates to a photoelectric conversion device, a photodetection device, and a photodetection method.

BACKGROUND ART

Currently, a silicon solar cell is widely utilized as one kind of photoelectric conversion device. Photoelectric conversion efficiency of a silicon solar cell has a logical limit of approximately 30%, and this is not such highly efficient energy conversion. This results from the following reasons: (i) near-infrared light whose wavelength is longer than a band edge of silicon (equivalent to wavelength of 1100 nm) does not contribute to photoelectric conversion, (ii) light whose wavelength is shorter than 1100 nm, although absorbed by silicon, is mostly not utilized in photoelectric conversion but converted into heat because of energy relaxation. In order to address the above two problems, it is required to create a photoelectric conversion system that realizes effective utilization of energy in all wavelength regions of the solar spectrum.

So far, for the purpose of effective utilization of solar energy, various developments have been made such as a dye-sensitized solar cell and a tandem solar cell using laminated semiconductors each of which has a different band gap. Such a photoelectric conversion device has been known in which titanium dioxide particles are deposited on a transparent electrode, onto which metal particles are applied and absorbed (see Non Patent Literature 1), and this device realizes photoelectric conversion in the visible light region.

Patent Literature 2 discloses that particles of platinum or palladium are so added to a dye-sensitized solar cell using titanium dioxide as to increase the absorption rate of dye made of ruthenium complex, thereby enhancing photoelectric conversion efficiency.

Meanwhile, various studies have been made on a scheme using titanium dioxide particles with silver or gold particles. Non Patent Literature 1 describes that titanium dioxide particles and gold nanoparticles are used to induce an electron transfer reaction on titanium dioxide particles, so as to realize photoelectric conversion in the visible light region. Non Patent Literature 2 describes that, using titanium dioxide and silver nanoparticles, photocatalysis and photocurrent corresponding to the plasmon band are observed in visible light. In Non Patent Literature 3, a surface photo-voltage (SPV) and a surface photo-current (SPC) in the anatase-type TiO2 particles with which gold is doped are measured so as to analyze charge separation and recombination processes. Patent Literature 1 discloses that a metal surface having a fine projection structure (in a form such as pyramid, stick, cuneiform, dendrite or spherical) is irradiated with light, so that plasmon absorption occurs, in which the irradiation light is absorbed into the metal due to the plasmon resonance, and electrons comes into a higher energy state and are extracted into a semiconductor layer, thereby achieving photoelectric conversion.

Among solar cells utilizing semiconductor substrates made of silicon or the like, it has been studied how to achieve efficient photoelectric conversion at the band edge, using a solar cell basically having PN junctions of semiconductors on which gold nanoparticles or nanostructures are arranged (Non Patent Literature 7, Non Patent Literature 8 and Non Patent Literature 9).

CITATION LIST

Patent Literature

Patent Literature 1: Japanese Patent Laid-Open No. 2007-073794
Patent Literature 2: Japanese Patent Laid-Open No. 2001-035551
Patent Literature 3: Japanese Patent Laid-Open No, 2002-231324

Non Patent Literature

Non Patent Literature 1: Yang Tian and Tetsu Tatsuma, "Mechanisms and Applications of Plasmon-Induced Charge Separation at TiO2 Films Loaded with Gold Nanoparticles", Journal of the American Chemical Society, 2005, 127 (20) 7632-7637
Non Patent Literature 2: Jiaguo Yu, Gaopeng Dai and Baibiao Huang, "Fabrication and Characterization of Visible light Driven Piasmonic Photocatalyst Ag/AgCl/TiO$_2$ Nanotube Arrays", J. Phys. Chem C2009, 113, 16394-16401
Non Patent Literature 3: Ping Wang, Teng-Feng Xie, Hai-Yan Li, Liang Peng, Yu Zhang, Tong-Shun Wu, Shan Pang, Yun-Feng Zhao, and De-Jun Wang, "Synthesis and Plasmon-Induced Charge-Transfer Properties of Monodisperse Gold-Doped Titania Microspheres", Chem. Eur. J. 2009, 15, 4366-4372
Non Patent Literature 4: Y. H, Su, W. H. Lai, L. G. TEOH, M. H. Hon and J. L. Huang, "Layer-by-layer Au nanoparticles as a schottky barrier in a water-based dye-sensitized solar cell", Appl. Phys. A 2007, 88, 173-178
Non Patent Literature 5: Tsuyoshi Akiyama, Kenta Aiba, Kazuko Hoashi, Meng Wang, Kosuke Sugawa and Sunao Yamada, "Enormous enhancement in photocurrent generation using electrochemically fabricated gold nano structures", Chem. Commum., 2010, 46, 306-308
Non Patent Literature 6: Stacey D. Standridge, George C. Schatz, and Joseph T. Hupp, "Distance Dependence of Plasmon-Enhanced Photocurrent in Dye-Sensitized Solar Cells", J. Am. Chem. Soc., 2009, 131, 8407-8409
Non Patent Literature 7: R. H. Franken, R. L. Stolk, H. Li, C. H. M. van der Werf, J. K. Rath and R. E. I. Schropp, "Understanding light trapping by light scattering textured back electrodes in thin film n-i-p-type silicon solar cells", J. Appl. Phys, 2007102, 014503-1-7
Non Patent Literature 8: M. J. Mendes, A. Luque, I. Tobias and A. Marti, "Plasmonic light enhancement in the near-infrared of metallic nanospheroids for application in intermediate band solar cells", Appl. Phys. Lett. 2009 95, 0711054-3
Non Patent Literature 9: Y. A. Akimov, W. S. Koh and K. Ostrikov, "Enhancement of optical absorption n thin-film solar cells through the excitation of higher-order nanoparticle Plasmon modes", Opt. Express 2009, 17, 10195-10205

SUMMARY OF INVENTION

Technical Problem

In the above-mentioned organic solar cell and dye-sensitized solar cell, enhanced optical near field based on the plasmon resonance is basically used to increase excitation efficiency of dye, thereby increasing photoelectric conversion efficiency of the organic solar cell or the dye-sensitized solar cell. Unfortunately, the absorption wavelength band of dye to be used limits the wavelength region where photoelectric conversion can be achieved, therefore, photoelectric conversion has not been yet realized in the near-infrared (Non Patent Literature 4, Non Patent Literature 5, and Non Patent Literature 6). Even in the techniques of the above mentioned Patent Literatures 1 to 3, Non Patent Literatures 1 to 3 and 7 to 9, photoelectric conversion has not been yet realized in the infrared wavelength region, either. As such, the above-mentioned techniques of the prior art have a disadvantage that the infrared wavelength region in the solar spectra cannot be effectively utilized as a solar cell. On the other hand, a tandem solar cell has a problem that the manufacturing process of laminated structures thereof becomes complicated.

The present invention has been made in the light of the above-mentioned problems, and has an object to provide a photoelectric conversion device which can be manufactured through a simple manufacturing process, achieve photoelectric conversion over a wide range of wavelength regions, and attain high photoelectric conversion efficiency even in the infrared wavelength region, a photodetection device and a photodetection method.

Solution to Problem

As a result of studies on photoelectric conversion capable of collecting lights having various wavelengths made by the present inventors, it was found that, by employing a structure in which metal particles are regularly arranged on a substrate, and, by firmly adhering metal structure bodies onto a titanium dioxide substrate with high crystallinity through adhesion layers made of thin metal films, it is possible to realize a photoelectric conversion system that achieves photoelectric conversion over a wide range of wavelength regions, and attains high photoelectric conversion efficiency even in the infrared wavelength region.

In order to solve the above-described problems, the photoelectric conversion device of the present invention includes a substrate containing single crystalline titanium dioxide; adhesion layers that are thin metal films formed on a surface of the substrate; metal structure bodies, each of which has a volume of 1,000 $nm^3$ or more and 3,000,000 $nm^3$ or less, arranged at predetermined intervals in a predetermined direction on surfaces of the adhesion layers; a container for containing an electrolyte solution in an arrangement region of the metal structure bodies on the surface of the substrate; a conductive layer formed on another surface of the substrate; and a counter electrode in contact with the electrolyte solution in the container, and the metal structure bodies adhere onto the substrate through the adhesion layers, a Schottky barrier is formed at an interface of the substrate with, the metal structure bodies, and photoelectric conversion is carried out for light in an infrared region by utilizing a plasmon resonance phenomenon.

According to this photoelectric conversion device, light is incident on the substrate containing titanium dioxide with high crystallinity and the metal structure bodies arranged at the predetermined intervals in the predetermined direction on the surface of the substrate through the adhesion layers made of thin metal films, so that the plasmon resonance is induced in the metal structure bodies, and intensive near-field light generated at an interface between the metal structure bodies and the substrate induces electronic excitation, resulting in electrons being injected into the substrate. The electrons injected into the substrate are taken out from the substrate through the conductive layer to the outside, and then returned to the electrolyte solution through the counter electrode, thereby generating, in accordance with the intensity of the light, photocurrent circulating through the photoelectric conversion device. The wavelength region of the light in resonant with the metal structure bodies can be variously controlled depending on the arrangement interval and the size of the metal structure bodies on the surface of the substrate, so that the range of the wavelengths can be widened readily. Particularly, a structure is employed in which metal structure bodies are regularly arranged on the substrate so that the firm adhesion through the adhesion layers between the metal structure bodies and the titanium dioxide substrate with high crystallinity enhances the adhesiveness at the bonded interface between the metal structure bodies and the substrate. As a result, light having various wavelengths is spatially and temporally trapped at the bonded interface between the metal structure bodies and the titanium dioxide substrate, which enables photoelectrical conversion for light in a wide range of wavelength regions, so that photoelectric conversion can be realized even in the infrared wavelength region, which cannot be achieved in the prior art. In addition, the metal structure bodies can be manufactured on the substrate through a relatively simple manufacturing process.

The photodetection device of the present invention includes the above-mentioned photoelectric conversion device, and an electrical measuring equipment connected to the conductive layer and the counter electrode.

The photodetection method of the present invention includes a step of irradiating with light a surface of a substrate containing single crystalline titanium dioxide in a state where an electrolyte solution is contained, the surface of the substrate having metal structure bodies, each of which has a volume of 1,000 $nm^3$ or more and 3,000,000 $nm^3$ or less, arranged thereon at predetermined intervals in a predetermined direction and adhered through adhesion layers that are thin metal films; and a step of detecting photocurrent generated between a counter electrode in contact with the electrolyte solution and a conductive layer formed on another surface of the substrate, and a Schottky barrier is formed at an interface of the substrate with the metal structure bodies, and photoelectric conversion is carried out for light in an infrared region by utilizing a plasmon resonance phenomenon.

According to this photodetection device or this photodetection method, the intensity of the light externally irradiated toward the substrate surface can be measured based on the photocurrent detected by the electrical measuring equipment, so that light in a wide range of wavelength regions including the infrared light region can be detected with more excellent sensitivity, compared to the prior art.

Advantageous Effects of Invention

According to the present invention, it is possible to provide a photoelectric conversion device which can be manufactured through a simple manufacturing process, achieve photoelectric conversion over a wide range of wavelength regions, and attain high photoelectric conversion efficiency even in the infrared wavelength region, a photodetection device, and a photodetection method.

BRIEF DESCRIPTION OF DRAWINGS

FIG. 2 is an electron micrograph of a surface of a substrate 2 in FIG. 1.

FIG. 7 are electron micrographs of surfaces of the substrate 2 on which metal microstructure bodies 3 are arranged at various arrangement intervals.

FIG. 12 is an electron micrograph of a surface of a substrate 102 in FIG. 11.

DESCRIPTION OF EMBODIMENTS

Figure 1:
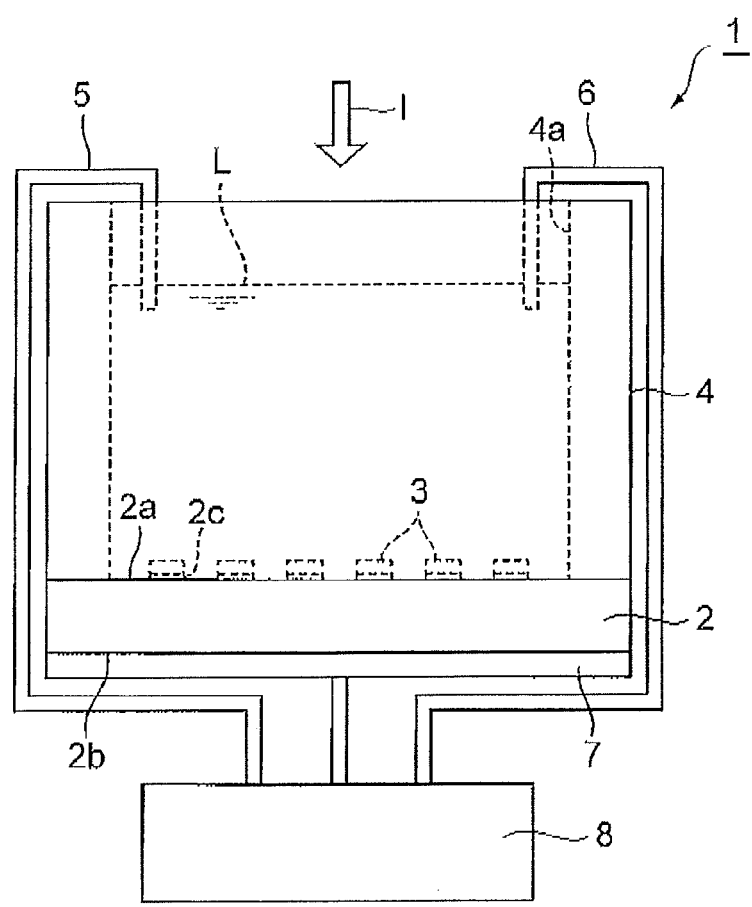
FIG. 1 is a front view of a photoelectric conversion device 1 according to one preferred embodiment of the present invention.

Hereinafter, detailed descriptions will be provided on the preferable embodiments of a photoelectric conversion device and a photodetection device including the same according to the present invention with reference to the drawings. Like reference numerals designate identical or corresponding components throughout descriptions of the drawings, and duplicated descriptions thereof will be omitted. Each drawing has been made for the sake of the explanations, in which target parts of the explanations are described in an emphasizing manner. Therefore, the size proportion of each member in the drawings is not always corresponding to that of the actual one.

FIG. 1 is a front view of a photoelectric conversion device 1 according to one preferred embodiment of the present invention. This photoelectric conversion device 1 is a photoelectric conversion system for utilizing a metal microstructure functioning as an optical antenna that collects incident lights having various wavelengths and localizes and amplifies the light, thereby converting light energy in a wide range of wavelength regions into electric energy. This photoelectric conversion device 1 is applicable to an optical sensor represented by a solar cell and an infrared CCD camera, for example.

As illustrated in the same drawing, the photoelectric conversion device 1 includes a substrate 2 including titanium dioxide ($TiO_2$), plural metal microstructure bodies 3 arranged on the substrate 2 through adhesion layers 2c, a container 4 for containing an electrolyte solution L along with the substrate 2, a counter electrode 5 and a reference electrode 6 inserted into the electrolyte solution L. Electrical measuring equipment 8 is electrically connected to a rear surface of the substrate 2, the counter electrode 5 and the reference electrode 6.

The substrate 2 is made of rutile type single crystalline titanium dioxide with high crystallinity, and the metal microstructure bodies 3 are arranged at a center of a surface 2a that is a surface (001) of, the substrate 2, and a conductive layer 7 is formed over almost the entire surface on a rear surface 2b side. The substrate 2 is a semiconductor substrate in a size of 10 mm×10 mm, for example, provided with annealing in a hydrogen-reduction atmosphere at a temperature of 900° C. for two hours, and the surface 2a thereof is mirror polished. In an arrangement region of the metal microstructure bodies 3 on the surface 2a of the substrate 2, the adhesion layers 2c that are thin metal films of chrome, titanium or the like are formed, and the metal microstructure bodies 3 adhere onto the surface 2a of the substrate through the adhesion layers 2c, thereby increasing their adhesiveness onto the substrate 2. At this time, the arrangement region of the metal microstructure bodies 3 is set to be in a size of 2.5 mm×2.5 mm, for example. The conductive layer 7 laminated on the substrate 2 is made of InGa alloy, for example, and is formed by being applied onto the rear surface 2b so as to come into an ohmic contact with the rear surface 2b side of the substrate 2. The substrate 2 is not limited to rutile type single crystalline titanium dioxide in a bulk form, and may be a substrate of a thin film made of titanium dioxide with high crystallinity, which is an aggregate of single crystalline titanium dioxide. The substrate of a thin film made of titanium dioxide with high crystallinity is preferable in the light of easy applicability to industrial mass production.

The plural metal microstructure bodies 3 arranged on the substrate 2 are made of metal material such as gold, silver, copper and platinum, and have a plasmon resonance absorption property relative to incident lights having various wavelengths depending on the size and shape. This plasmon resonance absorption property is a property to be resonant with incident light to localize the light and enhance the electric field, thereby causing a so-called localized surface plasmon phenomenon. The metal microstructure bodies 3 may be made of material other than metal, which is plated by the above-described metal.

FIG. 2 is an electron micrograph of a surface of the substrate 2 in FIG. 1. As illustrated in the same drawing, the metal microstructure bodies 3 are arranged on the surface 2a of the substrate 2 in such a manner that the bodies are two-dimensionally arranged in the X axial direction and in the Y axial direction perpendicular to the X axial direction at regular intervals. Each of the metal microstructure bodies 3 is uniform in size: 210 inn long in the X axial direction, 90 nm wide in the Y axial direction, and 40 nm high from the surface 2a, for example, and is formed in an approximately rectangular parallelepiped shape in which every adjacent face perpendicularly intersects each other. "Uniform in size" means that each of the metal microstructure bodies 3 has an approximately uniform area viewed from above the surface 2a, an approximately uniform volume, and an approximately uniform height from the surface 2a, "Uniform area" means that the degree of variability in area is 5% or less, preferably 2% or less, "uniform volume" means that the degree of variability in volume is 5% or less, preferably 3% or less, and "uniform height" means that the degree of variability in height is 10% or less, preferably 5% or less.

Each apex of the face of the metal microstructure bodies 3 viewed from above the surface 2a may not necessarily be a right angle, and may be in a rounded shape, or may be in a shape in which the apex is shaved off. In this case, however, every apex thereof is preferably uniform in shape. Specifically, each shape of the metal microstructure bodies 3 is not limited to a rectangular parallelepiped shape, and may be a shape in which a cut surface exists, at which two cut metal microstructures both have the same shape when cut in two.

The size of each metal microstructure body 3 is not limited to a particular one, but is preferably 1 nm to 1,000 nm, more preferably 10 nm to 500 nm in terms of the equivalent volume diameter, in order to achieve effective plasmon resonance absorption. Specifically, it is preferable that the area thereof is approximately 100 $nm^2$ to 30,000 $nm^2$, the volume thereof is approximately 1,000 $nm^3$ to 3,000,000 $nm^3$, the height thereof is 5 nm to 300 nm, more preferably approximately 10 nm to 100 nm.

As mentioned above, the metal microstructure bodies 3 are arranged at regular intervals. The term "regular intervals" means that the degree of variability in distance from each adjacent structure body is 5% or less.

Returning to FIG. 1, the container 4 for containing the electrolyte solution L along with the substrate 2 is joined to the edge of the surface 2a of the substrate 2 in the above-described configuration so as to surround the arrangement region of the metal microstructure bodies 3. The electrolyte solution L containing potassium chloride, sodium hydroxide, potassium hydroxide, iron chloride, potassium perchlorate, potassium ferricyanide, ferrocenecarboxylic acid or the like, is so contained in the container 4 as to fill the space above the arrangement region of the metal microstructure bodies 3 on the surface 2a.

The counter electrode 5 and the reference electrode 6 are inserted from an aperture end 4a at an upper position of the container 4 into the electrolyte solution L in the container 4. An example of the material for the counter electrode 5 includes platinum (Pt), and an, example of the reference electrode 6 includes a saturated calomel electrode (SCB). The substrate 2 functioning as a $TiO_2$ semiconductor working electrode is introduced into an electrode holder (not shown) having a light blocking effect and is provided with a window with a diameter of 2 mm, so that the electrolyte solution L comes in contact only with the arrangement region of the metal microstructure bodies 3 on the surface 2a, and light is irradiated externally onto the arrangement region.

Hereinafter, descriptions will be provided on a method for forming the metal microstructure bodies 3 on the substrate 2 in the photoelectric conversion device 1.

A positive electron lithography resist solution is spin-coated (rotationally coated) on the surface 2a of the substrate 2, and thereafter, baking (heating) is carried out, and then the resist solution is removed, so as to form a resist thin film on the substrate 2. At this time, in order to realize refinement of the metal microstructure bodies 3, the film thickness of the resist thin film formed on the substrate 2 is preferably not more than a micro meter, and is approximately 200 nm or less, for example. If the film thickness of the resist is set to be 200 nm or more, when patterning-exposure is carried out using an electron beam, the entire of the thick resist film is required to be exposed to the electron beam, thus the accelerating voltage of the electron beam is needed to be extremely high. The extremely high accelerating voltage rather deteriorates the spatial resolution of the drawing. Therefore, in order to attain the spatial resolution that enables precise drawing of the metal microstructure bodies 3, it is appropriate that the film thickness is set to be 200 nm or less.

A predetermined pattern is drawn on the formed resist thin film by use of electronic beam exposure equipment, for example. The predetermined pattern refers to a pattern made by tracing a desired arrangement pattern of the metal microstructure bodies 3. If the accelerating voltage of the electron beam is increased, the spatial resolution of the processing (drawing) becomes enhanced. On the other hand, if the dose rate of the exposure is increased, the exposure time becomes longer, and if the exposure time becomes longer, vibrations of a sample itself while being exposed (such as a noise due to an air conditioner in a laboratory or an extremely minute vibration noise caused by a device itself) cannot be ignored, so that an edge of the processing shape becomes "blur", which may result in deterioration of the processing resolution. Hence, the accelerating voltage of the electron beam and the dose rate of the exposure are set to be values in an appropriate relation therebetween.

Thereafter, development, rinsing and drying are carried out for the resist thin film for which the electron-beam exposure and lithography is provided. The development time is set to be appropriate time.

Moreover, chromium or titanium used for the adhesion layer 2c and metal having a plasmon resonance absorption property for the material of the metal microstructure bodies 3 are so sputtered sequentially as to form respective films on the substrate 2. The layer of chromium or titanium has a thickness of approximately 2 nm, and may enhance the adhesiveness between the substrate 2 and the metal material such as gold. The film thickness of the metal used for the metal microstructure bodies 3 is 10 nm to 100 nm.

The redundant resist material is so removed (peeled) from the substrate 2 as to form the plural metal microstructure bodies 3 thereon. The resist removal in this process is referred to as a "lift-off". In this lift-off, the substrate 2 is soaked in a chemical agent called as a resist remover, and is ultrasonic-cleaned so as to remove the redundant resist, for example. At this stage, in some cases, the redundant resist cannot be removed if the ultrasonic-cleaning is carried out at normal temperature, thus the redundant resist is preferably removed by the ultrasonic-cleaning while the resist remover is heated to 65° C. to 10° C.

The above-mentioned photoelectric conversion device 1 may be used as a photodetection device for detecting incident light I externally incident on the surface 2a of the substrate 2 by providing the electrical measuring equipment 8 electrically connected to the conductive layer 7 formed on the substrate 2, the counter electrode 5 and the reference electrode 6.

In order to detect the incident light I by use of this photo-detection device, the incident light I is externally irradiated toward the surface 2a of the substrate 2 in a state where the electrolyte solution L is contained in the space above the surface 2a of the substrate 2 in the container 4. Then, a photoelectrochemical measurement in a three-terminal method is carried out by use of the electrical measuring equipment 8, so as to detect photocurrent that circulates and is generated between the counter electrode 5 and the conductive layer 7.

According to the above-described photoelectric conversion device 1, the incident light I is incident on the substrate 2 containing titanium dioxide with high crystallinity and the nano-sized metal microstructure bodies 3 that are arranged at the predetermined intervals in the predetermined direction on the surface 2a of the substrate 2 through the adhesion layers 2c made of thin metal films, so that the plasmon resonance is induced in the metal microstructure bodies 3, and intensive near-field light generated at an interface between the metal microstructure bodies 3 and the substrate 2 induces electronic excitation, resulting in electrons being injected into the substrate 2. Specifically, free electrons existing in metal are oscillated by the oscillating electric field of the incident light, thereby inducing collective motions of free electrons, and as a result, the metal microstructure bodies 3 acquire energy. At this time, the metal microstructure bodies 3 have a greater area like a parabolic antenna, compared to molecules or the like, so that the metal microstructure bodies 3 can be efficiently resonant with the light, and can not only localize the resonance phenomenon to a certain space, but also trap the light for a certain time. Commonly, light passes through a nano-structure in several tens of attoseconds, but the phase relaxation time of this plasmon continues as long as ten femtoseconds or more. Accordingly, not only feeble light is amplified to be effectively utilized, but also energy is acquired by the metal nano-structure, which allows the electron injection into the semiconductor substrate resulted from the electron transfer from the metal. In addition, the electron transfer can be achieved not only in visible light but also in infrared light, so that, depending on the design of a metal nano-structure, it is possible to effectively utilize solar light in a wide range of wavelength regions in the case of an application to solar power generation, for example.

The electrons injected into the substrate 2 is taken out from the substrate 2 through the conductive layer 7 to the outside, and then is returned to the electrolyte solution L through the counter electrode 5, thereby generating, in accordance with the intensity of the light, photocurrent circulating through the photoelectric conversion device 1. The wavelength region of the light in resonant with the metal microstructure bodies 3 can be variously controlled depending on the arrangement interval and the size of the metal microstructure bodies 3 on the substrate surface 2a, and the range of the wavelengths can be widened readily. Particularly, the firm adhesion through the adhesion layers 2c, between the metal microstructure bodies 3 regularly arranged on the substrate 2 and the titanium dioxide substrate 2 with high crystallinity enhances the adhesion at the bonded interface between the metal microstructure bodies 3 and the substrate 2. As a result, lights having various wavelengths are spatially and temporally trapped at the bonded interface between the metal microstructure bodies 3 and the titanium dioxide substrate 2, which enables photo-electrical conversion for light in a wide range of wavelength regions, so that photoelectric conversion can be realized even in the infrared wavelength region, which cannot be achieved in the prior art. In addition, the metal microstructure bodies 3 can be manufactured on the substrate 2 in an electron-beam lithography/lift-off method, which is a relatively simple manufacturing process.

Using a halogen lamp and a Band-Pass Filter (full width at half maximum of 10 nm) in the argon degassing condition, various measurement results regarding the photoelectric conversion device 1 in which the substrate 2 is irradiated with monochromatic light are shown, as follows.

Figure 3:
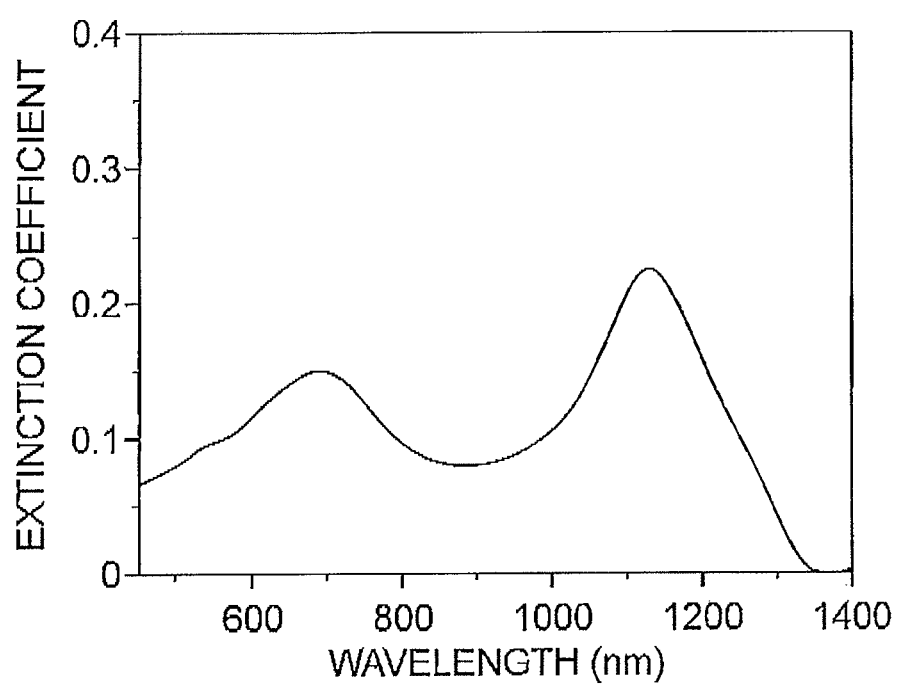
FIG. 3 is a graph showing a plasmon resonance spectrum of the photoelectric conversion device 1 in FIG. 1.

FIG. 3 is a graph showing the absorption characteristics in relation to the wavelength of the incident light I. As shown in this result, in the metal microstructure bodies 3 having the length of 210 nm, the width of 90 inn and the height of 40 nm, two plasmon resonance bands were observed: one is a plasmon resonance band (center wavelength: 700 nm) induced by electronic oscillations in the Y axial direction, and the other is a plasmon resonance band (center wavelength: 1,100 nm) in the X axial direction.

Figure 4:
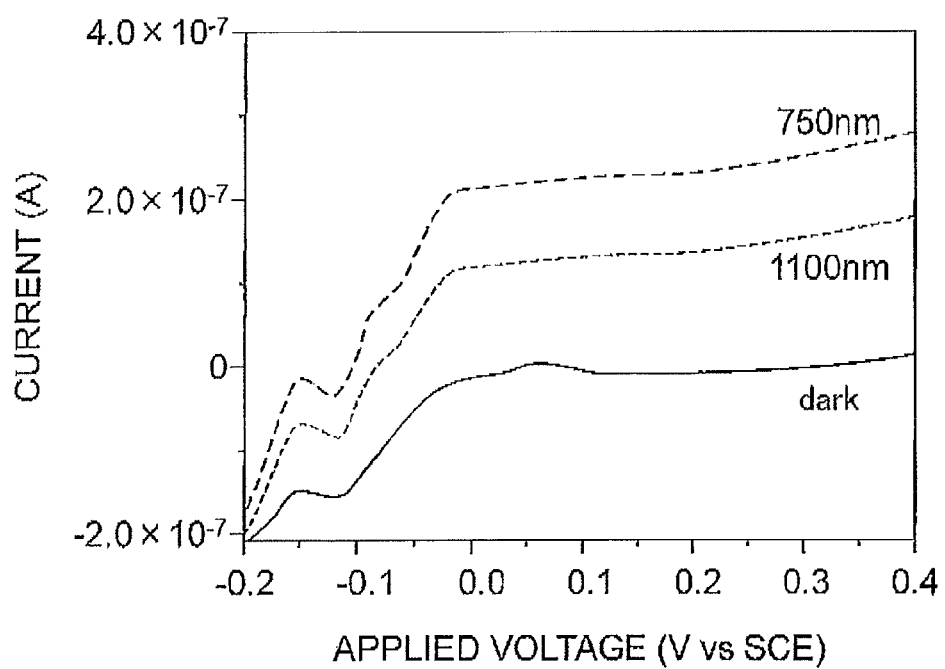
FIG. 4 is a graph showing current-voltage characteristics of the photoelectric conversion device 1 in FIG. 1.

FIG. 4 shows a result of the photoelectrochemical measurements in the three-electrode method, using potassium chloride solution as the electrolyte solution L. From this result, approximately constant photocurrent was observed at an applied voltage of 0 to 0.1 V relative to the reference electrode 6, even when near-infrared lights having wavelengths of 750 nm and 1,100 nm were irradiated.

Figure 5:
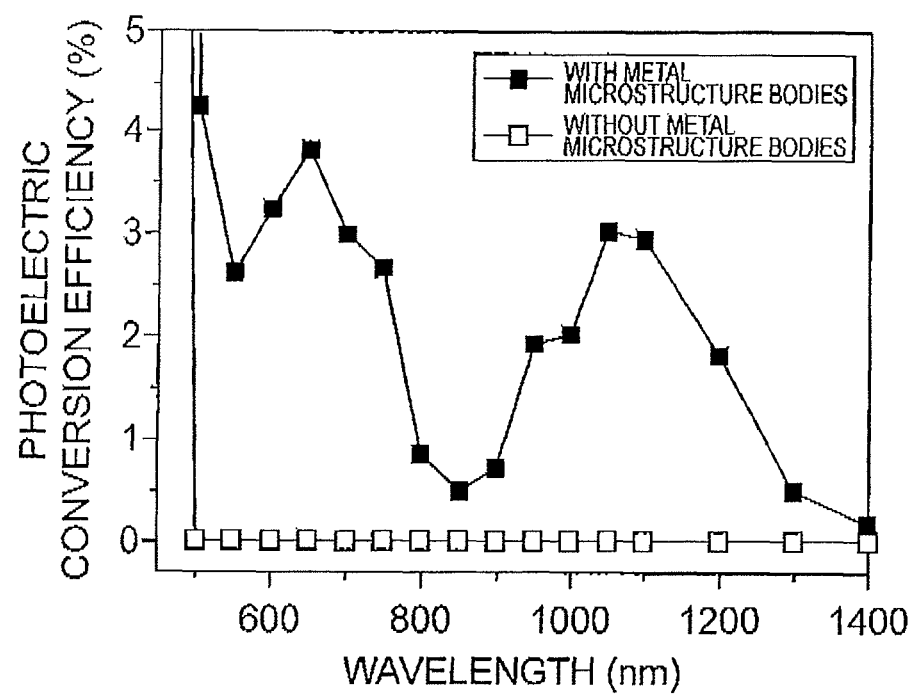
FIG. 5 is a graph showing wavelength dependence of the photoelectric conversion efficiency of the photoelectric conversion device 1 in FIG. 1 in a non-polarized light condition.

FIG. 5 is a graph showing a relation between the wavelength of the incident light Y and the photoelectric conversion efficiency. This photoelectric conversion efficiency (IPCE (%)) is obtained based on the proportion of the number of flowing electrons (current) to the number of incident photons (intensity of the incident light). From the result, photocurrent action spectra having peaks at the wavelength of 700 nm and the wavelength of 1,100 mm were observed (non-polarized light condition), corresponding to the plasmon resonance bands observed in FIG. 3. The same measurement was made on a substrate 2 without using metal microstructure bodies, and photo current was observed only in the wavelength of 450 nm or less. Specifically, a $TiO_2$ substrate commonly has its band gap within the ultraviolet region of approximately 3.2 eV, so that this substrate can achieve photoelectric conversion only for the ultraviolet light (wavelength of 400 nm or less). In addition, a conventional dye-sensitized solar cell achieves photoelectric conversion only for light in the visible region. To the contrary, the present embodiment realizes photoelectric conversion even in the infrared region, particularly in the near-infrared region of 1,100 nm, which has not been achieved by a photoelectric conversion device of the prior art.

Figure 6:
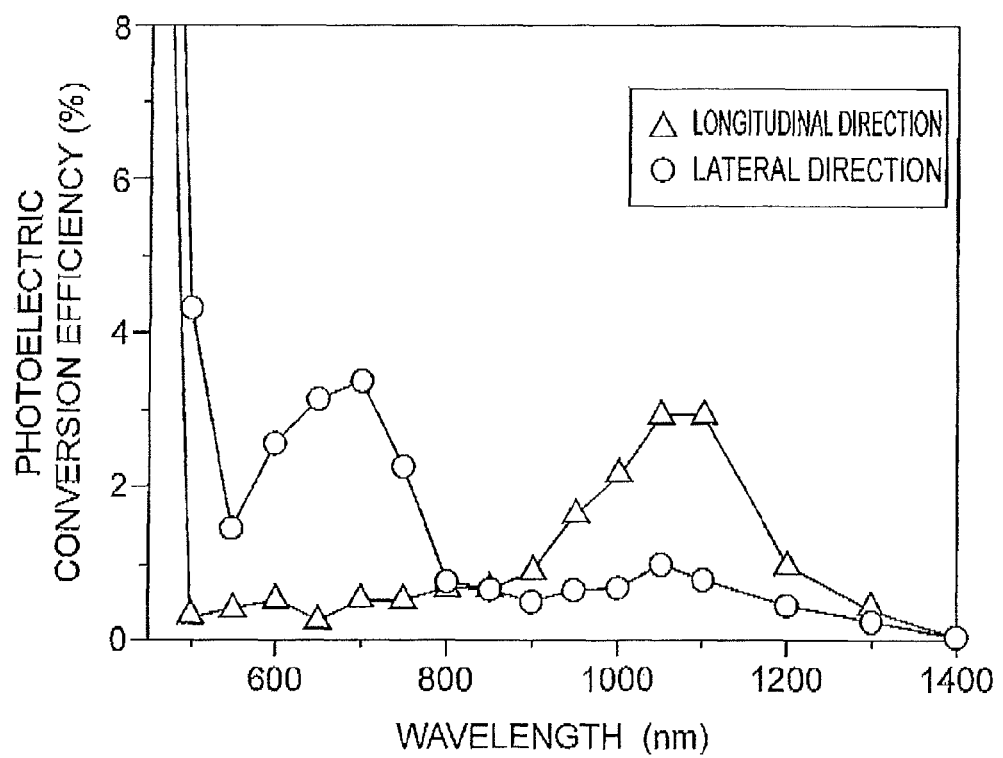
FIG. 6 is a graph showing wavelength dependence of the photoelectric conversion efficiency of the photoelectric conversion device 1 in FIG. 1 in a polarized light irradiation condition.

FIG. 6 shows a result of the same measurement as in FIG. 5 by irradiating the incident light I in the polarized light irradiation condition. From this result, in the polarized light irradiation condition for inducing a plasmon in the lateral direction (Y axial direction), photocurrent was observed only in the wavelength region corresponding to the plasmon resonance band in the lateral direction, and in the polarized light irradiation condition for inducing a plasmon in the longitudinal direction (X axial direction), photocurrent was selectively observed in the wavelength region corresponding to the plasmon resonance band in the longitudinal direction. Specifically, it was found that the plasmon resonance collects light like an antenna and injection of the electrons into the titanium dioxide is carried out.

Figure 8:
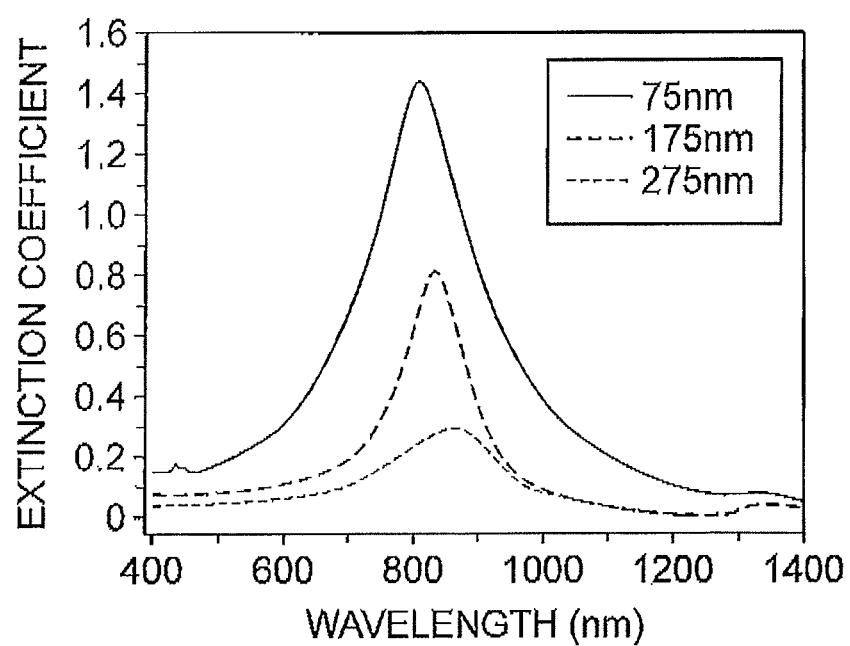
FIG. 8 is a graph showing a plasmon resonance spectrum of the photoelectric conversion device 1 in which the metal microstructure bodies 3 have various arrangement intervals.
Figure 9:
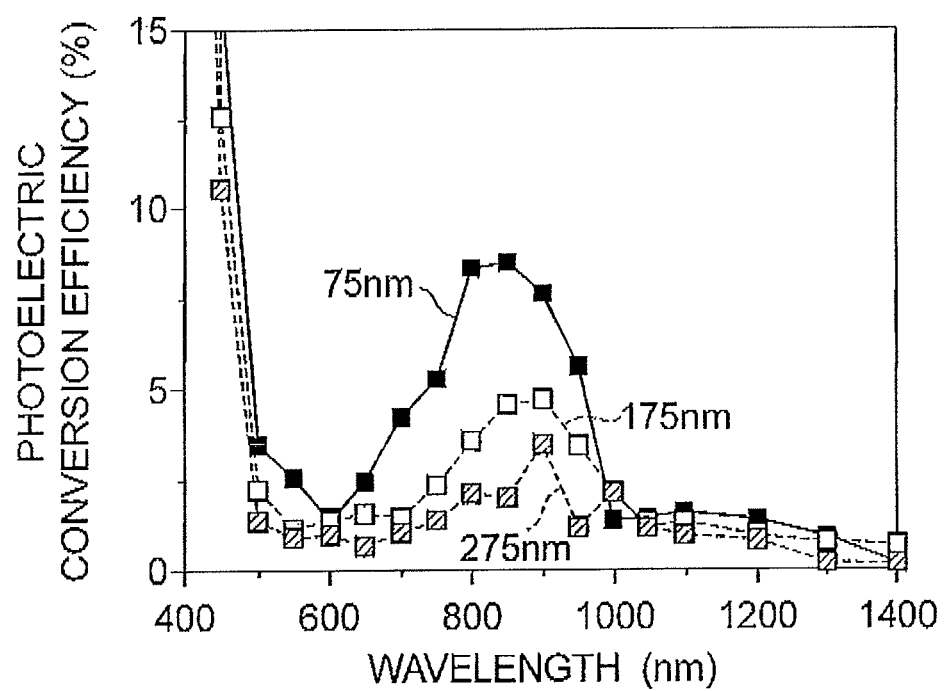
FIG. 9 is a graph showing wavelength dependence of the photoelectric conversion efficiency of the photoelectric conversion device 1 in which the metal microstructure bodies 3 have various arrangement intervals.

FIG. 8 and FIG. 9 show a result of measurements on the photoelectric conversion device 1, in which various arrangement intervals were used in the metal microstructure bodies 3 on the substrate 2. In the measurements, a uniform size of 125 nm×125 nm×40 nm was used for each of the metal microstructure bodies 3, and various distances of 275 nm, 175 nm and 75 nm were used for the interval between each structure body, respectively, as shown in FIGS. 7(a) to 7(c).

FIG. 8 is a graph showing the absorption characteristics relative to the wavelength of the incident light I. As shown from the result, it is learned that because each of the metal microstructure bodies 3 has a square shape viewed from above the surface 2a of the substrate 2 and its aspect ratio is 1:1, only one band of, the plasmon resonance spectrum was observed in the vicinity of 800 nm to 900 nm, and if the density of the metal microstructure bodies 3 becomes increased, the resonance efficiency between the incident light I and the metal microstructure bodies 3 becomes higher. Addition to this, in the photocurrent action spectrum illustrated in FIG. 9, it is shown that, if the density of the metal microstructure bodies 3 becomes increased, the photoelectric conversion efficiency becomes higher, and there is a close correlation with the wavelength of the plasmon resonance band. This measurement result shows that the photoelectric conversion efficiency can be enhanced depending on the structural design for the metal microstructure bodies 3.

Figure 10:
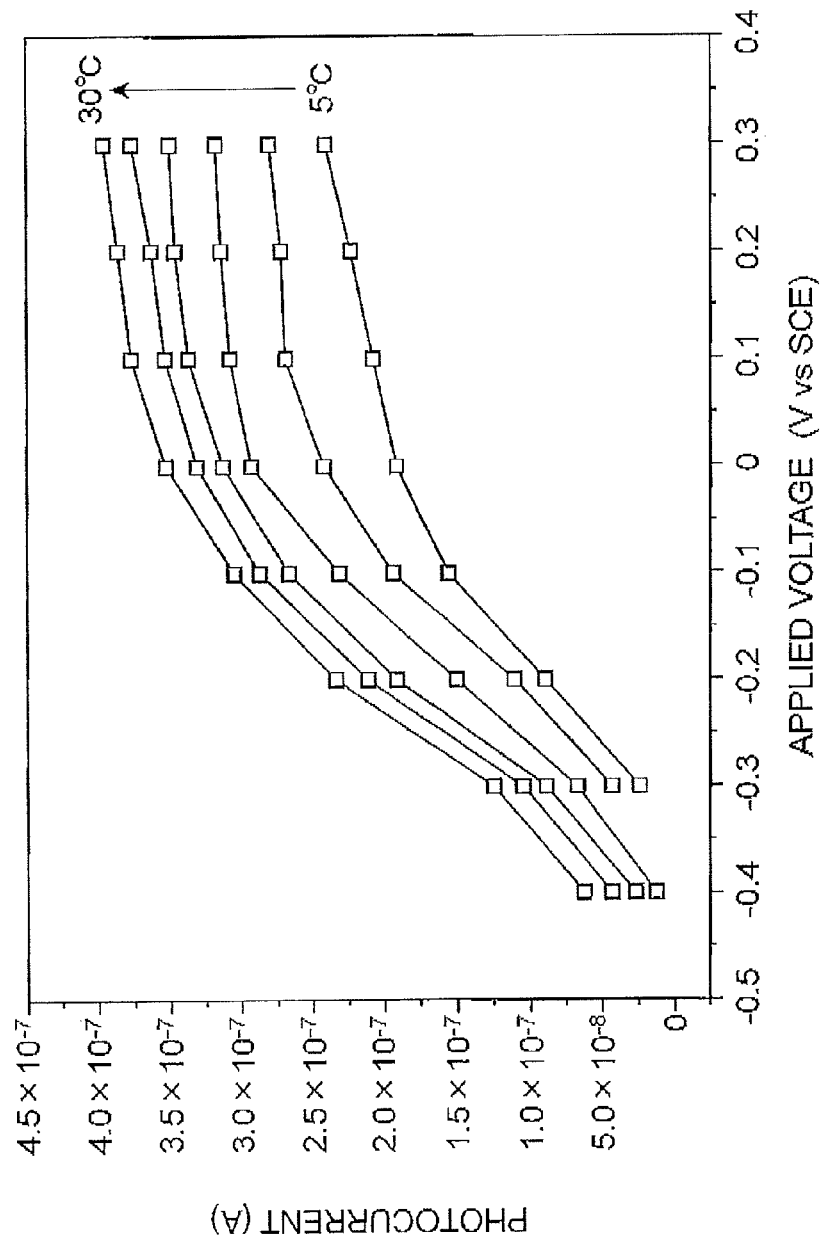
FIG. 10 is a graph showing temperature dependence of current-voltage characteristics of the photoelectric conversion device 1 in FIG. 1.

FIG. 10 shows that the temperature dependence in the applied voltage-photocurrent characteristics in the case of irradiating the incident light I whose wavelength is 750 nm. This measurement result shows that, in the photoelectric conversion device 1, as the operation temperature thereof becomes higher, the photoelectric conversion efficiency thereof becomes increased. In a common silicon solar cell of the prior art, a higher operation temperature deteriorates the efficiency in some cases. This is due to decrease in output voltage because the band gap energy (1.2 eV in the case of silicon) becomes decreased at a higher temperature. On the other hand, in the present embodiment, it is supposed that the increase in temperature enhances the electron injection from the metal into the titanium dioxide, or the speed of electron transfer from the electron donor molecules to the metal in the electrolyte solution.

Figure 11:
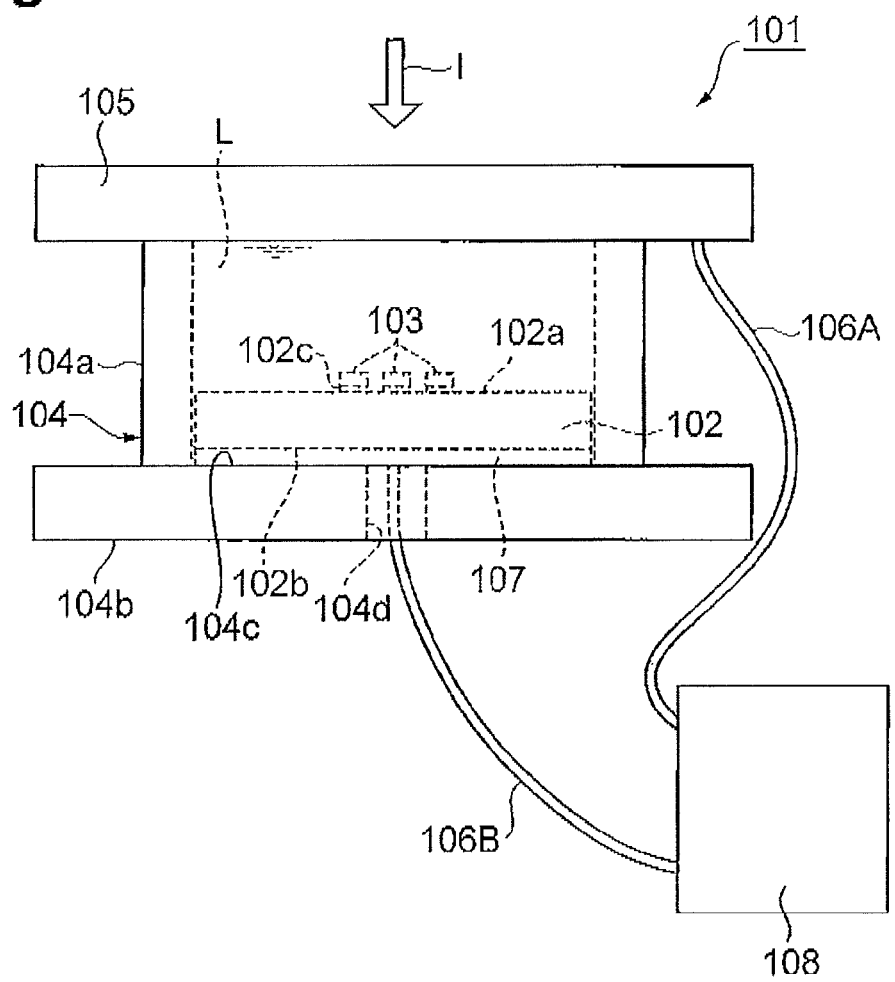
FIG. 11 is a front view of a photoelectric conversion device 101 according to another embodiment of the present invention.

Hereinafter, another embodiment of the present invention will be described. FIG. 11 is a front view of a photoelectric conversion device 101 according to another embodiment of the present invention. This photoelectric conversion device 101 is an application example of the present invention as a solar cell that is a photoelectric conversion device in the bipolar system enabling photoelectric conversion from the visible light region to the near-infrared light region. The main differences between this photoelectric conversion device 101 and the photoelectric conversion device 1 are that the photoelectric conversion device 101 is configured as a solar cell in the bipolar system without using the reference electrode, and has the counter electrode with a different material and shape.

The photoelectric conversion device 101 illustrated in the same drawing includes a substrate of rutile type single crystalline titanium dioxide as a substrate 102 with which 0.05 wt % of niobium (Nb) is doped, metal microstructure bodies 103 are arranged through adhesion layers 102c at a center of a surface 102a which is a surface (001) of the substrate 102, and a conductive layer 107 is formed over almost the entire of a rear surface 102b side. The substrate 102 has the surface 102a in a size of 10 mm×10 mm, and the metal microstructure bodies 103 are formed at the center region in a size of 2.5 mm×2.5 mm on the surface 102a, using the same processing method as that of the substrate 2. Specifically, in the arrangement region of the metal microstructure bodies 103 on the surface 102a of the substrate 102, the adhesion layers 102c that are thin metal films are formed, and the metal microstructure bodies 103 adhere onto the surface 102a of the substrate through the adhesion layers 102c, thereby enhancing their adhesiveness to the substrate 102. The conductive layer 107 laminated on the substrate 102 is made of InGa alloy, for example, and is formed by being applied onto the rear surface 102b, as similar to the conductive layer 7.

Figure 13:
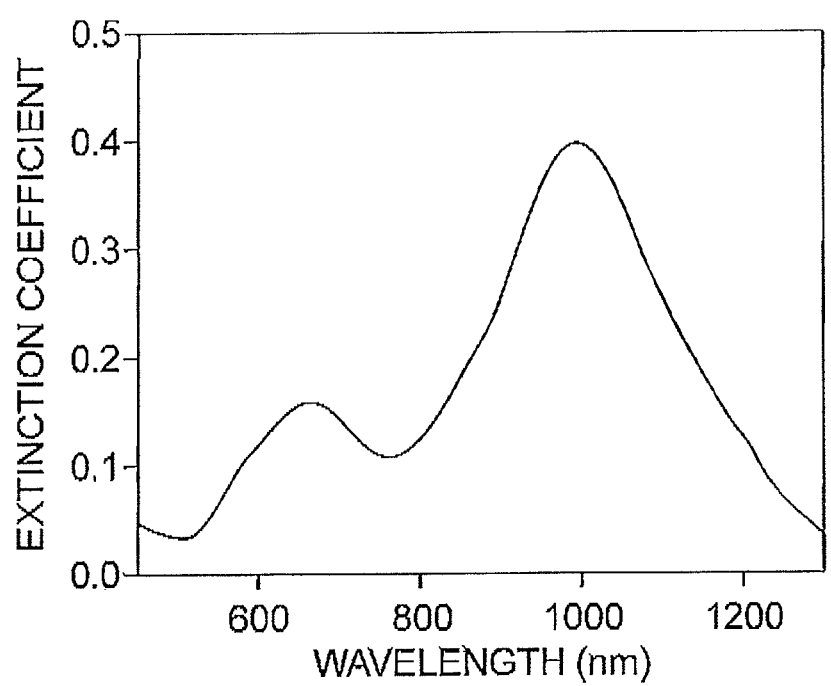
FIG. 13 is a graph showing a plasmon resonance spectrum of the photoelectric conversion device 101 in FIG. 11.

FIG. 12 is an electron micrograph of a surface of the substrate 102 in FIG. 11. As illustrated in the same drawing, each of the metal microstructure bodies 103 two-dimensionally arranged at regular intervals on the surface 102a of the substrate 102 has a width of 110 nm in the X axial direction, a length of 240 nm in the Y axial direction and a height of 40 nm from the surface 102a. The substrate 102, on which the metal microstructure bodies 103 in the above-described structure are formed, has the absorption characteristics in the water relative to the wavelength of, the incident light I incident on the surface 102a, as illustrated in FIG. 13. Specifically, two plasmon resonance bands are observed: one is a plasmon resonance band (center wavelength: 650 nm) induced by electronic oscillations in the X axial direction, and the other is a plasmon resonance band (center wavelength: 1,000 nm) in the Y axial direction.

The photoelectric conversion device 101 includes a transparent electrode plate 105 that is the counter electrode provided so as to oppose the metal microstructure bodies 103 on the surface 102a of the above-configured substrate 102, and a container 104 including a side wall 104a and a base 104b, and containing the substrate 102 and the electrolyte solution L therein.

The transparent electrode plate 105 is a tabular transparent electrode made of indium oxide tin (ITO) or fluorine doped tin oxide (FTO) or the like, and has a property to transmit the incident light I in a wide range of wavelength regions from the visible light region to the near-infrared light region. The transparent electrode plate 105 is arranged approximately in parallel to the base 104b that is a tabular member in a state where the side wall 104a that is a cylindrical member is held between them.

The substrate 102 is so disposed on a face 104c of the base 104b on the transparent electrode plate 105 side as to be contained in a closed space created by the transparent electrode plate 105 and the container 104. At this time, the metal microstructure bodies 103 on the substrate 102 and the transparent electrode plate 105 are arranged at a predetermined interval (5 mm, for example) therebetween. This predetermined interval between the metal microstructure bodies 103 and the transparent electrode plate 105 is one example, and this interval may be set smaller from the perspectives of reduction in a voltage drop caused by solution resistance and enhancement of the power generation efficiency.

The electrolyte solution L is so introduced into the container 104 as to come into contact with the transparent electrode plate 105. Accordingly, the space between the arrangement region of the metal microstructure bodies 3 on the substrate 102 and the transparent electrode plate 105 is filled with the electrolyte solution L.

A lead 106A is connected to this transparent electrode plate 105 and a lead 106B is connected to the conductive layer 107 of the substrate 102 with metallic paste such as silver. This lead 106B extends from the conductive layer 107 through a through hole 104d formed in the base 104b to the outside. By connecting these leads 106A and 106B to an electrochemical analyzer 108 that performs photoelectrical conversion measurements in the bipolar system, the photoelectric conversion device 101 can be applied as a photodetection device including the electrochemical analyzer 108. Instead of using this electrochemical analyzer, a current voltmeter, a semiconductor parameter analyzer or the like may be used.

The substrate 102 functioning as a TiO2 semiconductor working electrode is introduced into an electrode holder (not shown) provided with a window whose diameter is 2 mm and having a light blocking effect, so that the electrolyte solution L comes in contact only with the arrangement region of the metal microstructure bodies 103 on the surface 102a, and light is irradiated externally.

Figure 14:
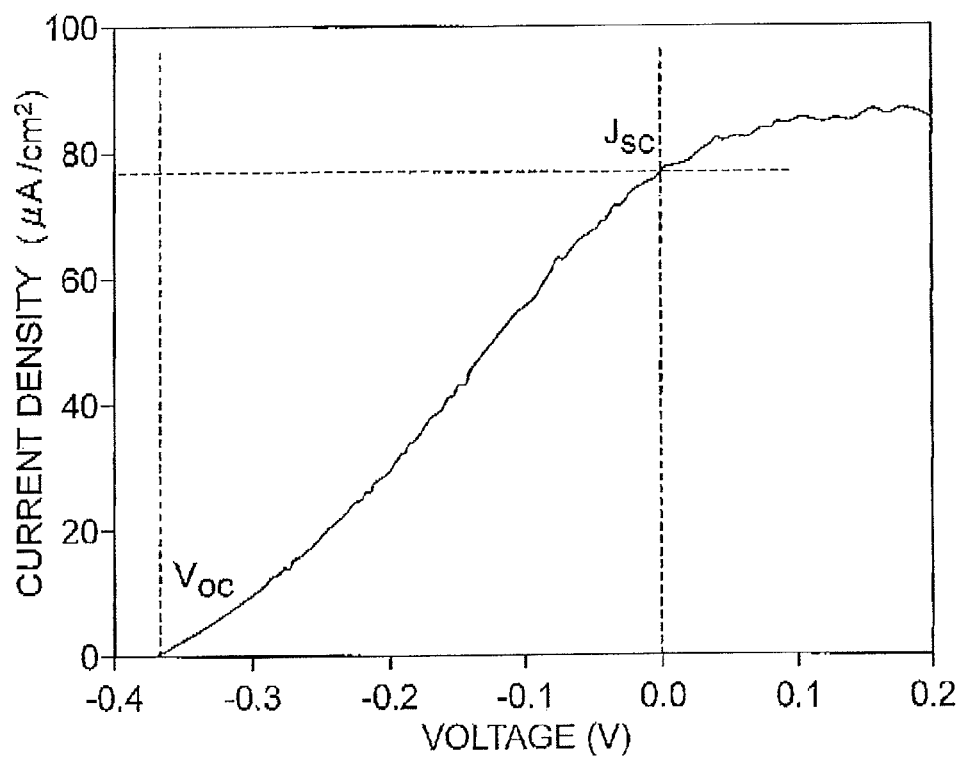
FIG. 14 is a graph showing the current-potential characteristics in the case where the photoelectric conversion device 101 in FIG. 11 is irradiated with continuous white light.

FIG. 14 shows a result of measurements of current-potential characteristics (I-V curve) in the case where the electrochemical analyzer 108 is connected to the above configured photoelectric conversion device 101, and continuous white light having the wavelength region of 500 nm to 1,300 nm is externally irradiated toward the transparent electrode plate 105. From this result, it was found that the photoelectric conversion device 101 attains the open circuit voltage VOC of 0.37 V and the short circuit current density JSC of 78 $\mu A/cm^2$, and effectively functions as a solar cell.

Figure 15:
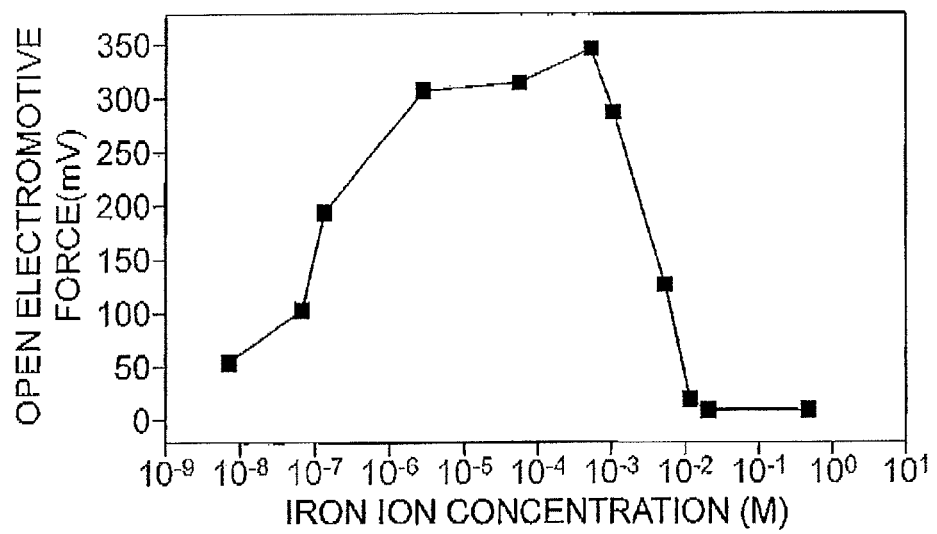
FIG. 15 is a graph showing a measurement result of open electromotive force in the case where bivalent iron oxide and trivalent iron oxide are added in various concentration conditions to the photoelectric conversion device 101 in FIG. 11.

It has been commonly known that electromotive force as a battery significantly varies depending on the kind of electron donors and acceptors and the ratio of concentration therebetween in a supporting electrolyte solution. Hence, an electron donor-acceptor system was built up by using bivalent and trivalent iron oxides in the photoelectric conversion device 101, so as to optimize its concentration condition. FIG. 15 shows a result of measurements of open electromotive force in various concentration conditions, in the case where the bivalent iron oxide and the trivalent iron oxide in the mole ratio of 1:1 are added in the supporting electrolyte solution. From this result, it was found that the maximum electromotive force of approximately 380 mV can be obtained when the iron ion concentration is $1.0 \times 10^{-3}$ M. This result corresponds to the electromotive force determined by the valence band of the iron oxide and the oxidation-reduction potential of the donor. It was found that, when the amount of donor-acceptor molecules is small, the reverse reaction of the acceptor molecules in anode does not progress, so that high electromotive force cannot be obtained, but the electromotive force drastically increases at the time of adding the acceptor molecules of approximately $10^{-7}$ M or more. It was also found that the electromotive force decreases if the iron ion concentration is increased, specifically, if iron ion at the concentration of approximately $10^{-3}$ M or more is added.

Figure 16:
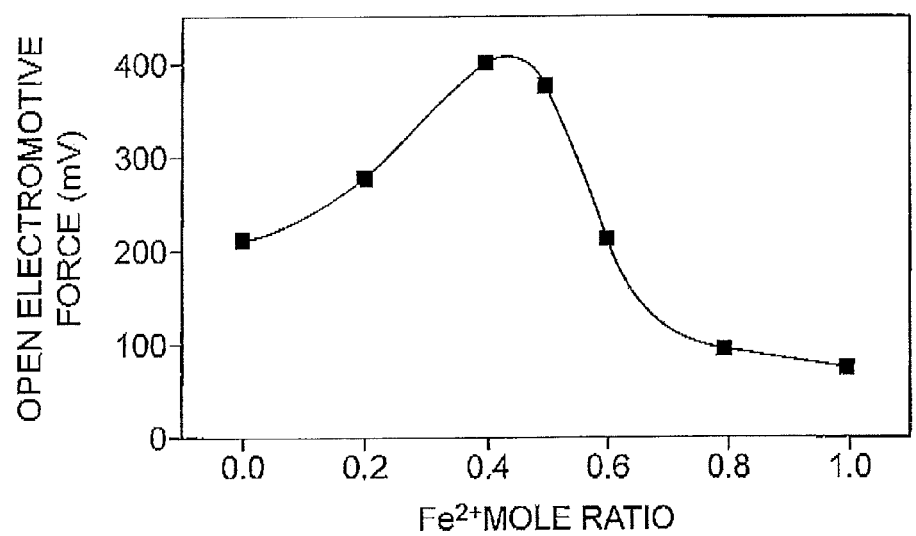
FIG. 16 is a graph showing a measurement result of open electromotive force, in the case where the bivalent iron oxide and the trivalent iron oxide are added in various concentration conditions to the photoelectric conversion device 101 in FIG. 11.

FIG. 16 shows a result of measurements of open electromotive force, in the case where the total concentration of the bivalent iron oxide and the trivalent iron oxide is fixed at $1.0 \times 10^{-3}$ M, using various mole ratios thereof. From the result, the electromotive force exhibits the maximum value when the mole ratio of bivalent iron ion is approximately 0.5 to 0.6. This shows that not only a difference in energy between the donor-acceptor molecules and the valence band of titanium dioxide determines the electromotive force, but also the reductive reaction of acceptor molecules in anode has a significant effect upon this electromotive force.

According to the above-described photoelectric conversion device 101, in addition to the effects achieved by the photoelectric conversion device 1, it is possible to achieve photoelectric conversion using ultraviolet light, visible light and infrared light, and to realize a solar cell capable of converting all wavelengths of solar light into electric energy. In addition, the bipolar system is employed so as to realize a compact and thin device. The tabular transparent electrode plate 105 is used as the counter electrode so as to widen the wavelength range in which photoelectric conversion can be achieved on the substrate surface. As a result, it is possible to reduce loss of the incident light due to light absorption, reflection and dispersion by the counter electrode.

Figure 17:
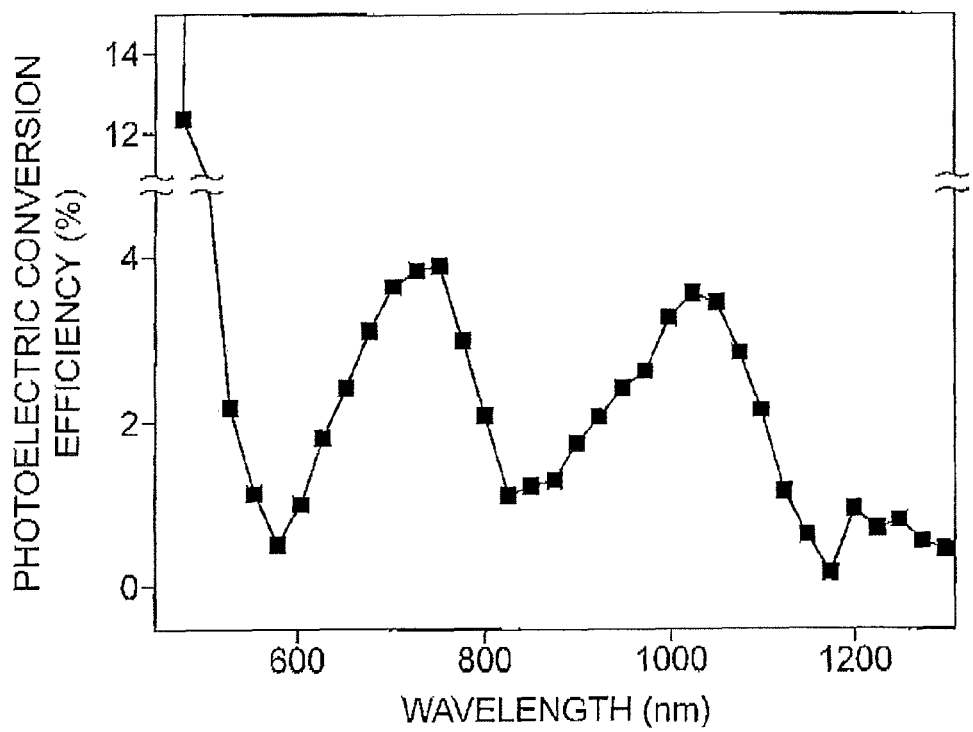
FIG. 17 is a graph showing wavelength dependence of the photoelectric conversion efficiency of the photoelectric conversion device 101 in FIG. 11.

FIG. 17 is a graph showing a relation between the wavelength of the incident light I and the photoelectric conversion efficiency in the photoelectric conversion device 101. Based on this, the photocurrent action spectrum was observed corresponding to the plasmon resonance band observed in FIG. 13. From this result, it was found that the photoelectric conversion device 101 can realize efficient photoelectric conversion for ultraviolet light, visible light and infrared light at normal temperature.

As described above, the photoelectric conversion device 101 can construct a solar cell for all wavelengths that achieves photoelectric conversion using ultraviolet light, visible light and infrared light, and can convert all wavelengths of solar light into electric energy. Accordingly, since infrared light has high transparency relative to human skin, the photoelectric conversion device 101 enables semi-permanent power generation once the device is embedded in a body; and can be so embedded in a body as to serve as equipment for monitoring health conditions of the body. As a result, the present embodiment can realize an invention to satisfy the needs of the next-generation science technologies in home diagnostic and personalized medicine fields. Titanium, gold, oxygen, potassium chloride and the like included in the present embodiment are all elements whose medical safety is already guaranteed, and this is one of the features of the present embodiment.

Figure 18:
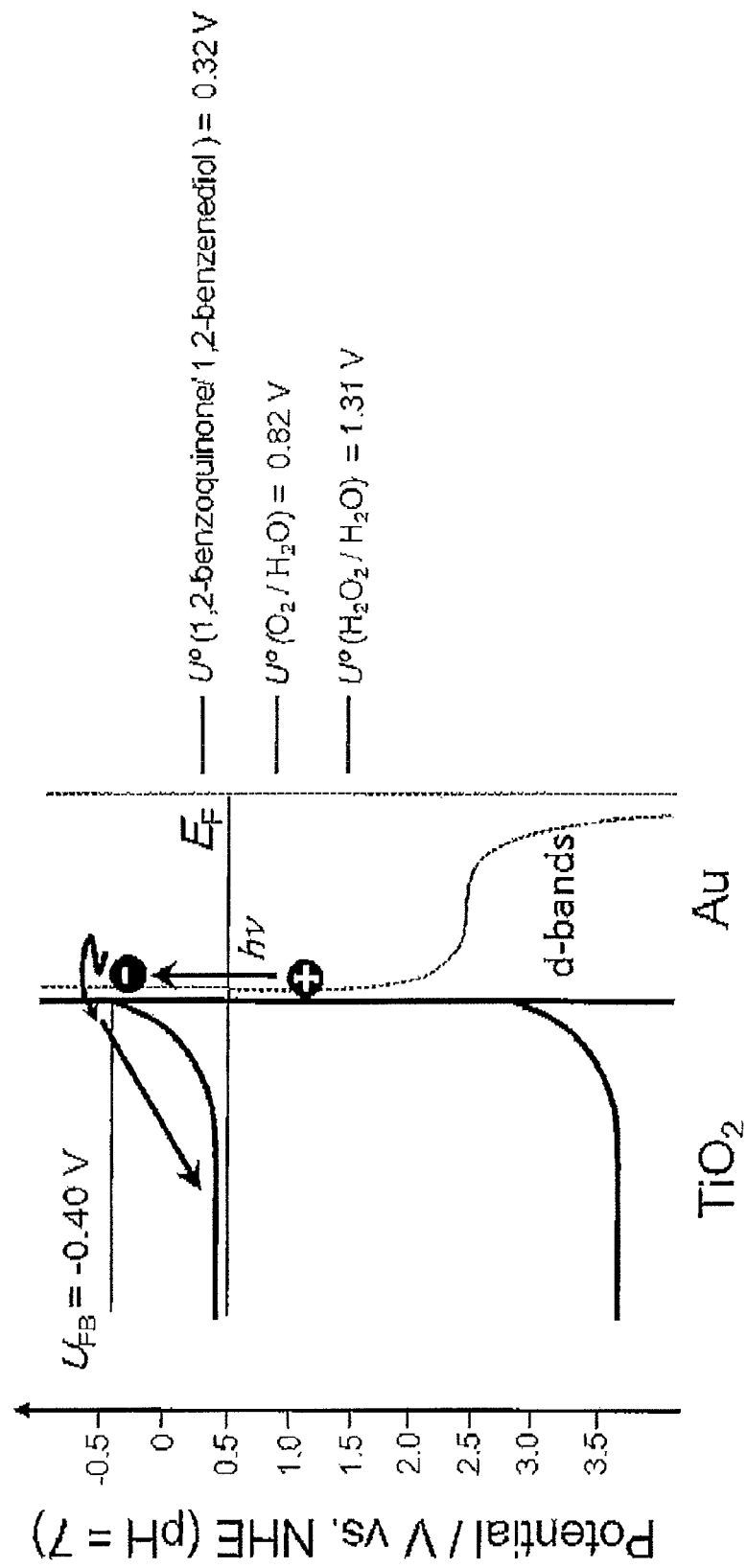
FIG. 18 is an energy diagram for explaining mechanism of photocurrent excitation in the photoelectric conversion devices 1 and 101 illustrated in FIG. 1 and FIG. 11, respectively.

FIG. 18 is an energy diagram for explaining a mechanism of photocurrent excitation between the metal microstructure bodies 3 and 103 made of gold (Au) and the substrates 2 and 102 in the photoelectric conversion devices 1 and 101, respectively. As illustrated in the same drawing, a Schottky barrier is formed at the bonded interface with the metal microstructure bodies 3 and 103 on the substrates 2 and 102 side, respectively. For example, an incidence of light having a wavelength smaller than 700 nm onto the metal microstructure bodies 3 and 103 excites a localized surface plasmon (LSP), thereby causing an interband transition from the d band to the sp conduction band. Hence, pairs of excited electrons and electron holes are generated in the vicinity of the interface between the substrates 2 and 102 and the metal microstructure bodies 3 and 103, respectively, and the holes are captured by the surface state of the substrates 2 and 102. As is known, the state density of the d band of gold (Au) is approximately 1.8 eV lower than the Fermi level, thus probability of the interband transition from the d band to the sp conduction band caused by light having a wavelength of 700 nm to 1,300 nm is considered to be extremely low. Even so, the extremely intensive optical near field locally enhanced by the plasmonic enhancement effect encourages the electron excitation in the near-infrared wavelength as a resultant of the electron transport from the metal microstructure bodies 3 and 103 to the substrates 2 and 102, respectively. The plasmonic enhancement effect is obtained by spatial and temporal confinement at the edge of the metal microstructure bodies 3 and 103 (particularly, at the interface between the metal microstructure bodies 3 and 103 and the substrates 2 and 102, respectively). It is considered that, in the arrangement of the metal microstructure bodies 3 and 103 on the substrates 2 and 102, respectively, the flat band potential of the metal microstructure bodies 3 and 103 shifts positively, the excited electrons also transfer to the conduction band of the substrates 2 and 102 due to the light irradiation of 1 eV, and photocurrent is generated through hydroxide or multi-electron oxidation of water molecules in the holes, as illustrated in the same drawing. The following two documents describe that potential of, a nanostructure of gold arranged on a titanium dioxide wafer shifts positively.

Nakato, Y.; Shioji, M.; Tsubomura, H. "Photoeffects on the Potentials of Thin Metal-Films on a n-TiO2 CrystalWafer—The Mechanism of Semiconductor Photocatalysts." Chem. Phys. Left, 1982, 90, 453-456; Nakato, Y; Tsubomura, H. "Structures and Functions of Thin Metal Layers on Semiconductor Electrodes." J. Photochem. 1985, 29, 257-286.

The present invention is not limited to the above-described embodiments. The photoelectric conversion device 1 of the embodiments has three electrodes, but may operate only using two electrodes without the reference electrode 6.

The counter electrode (anode) is preferably a tabular transparent electrode that is provided so as to oppose the metal structure bodies on the surface of the substrate. The counter electrode (anode) in such a configuration can widen the range of the wavelengths where photoelectric conversion can be achieved on the substrate surface. As a result, it is possible to reduce loss of the incident light due to light absorption, reflection and dispersion by the counter electrode.

The reference electrode inserted into the electrolyte solution in the container may further be provided. This configuration can realize photoelectric conversion in a wide range of wavelength regions in the triple-electrode system as well.

The metal structure bodies are preferably arranged two-dimensionally on the surface in the first direction and in the second direction perpendicular to the first direction. In this case, the photoelectric conversion efficiency and the wavelength sensitivity can be readily controlled by adjusting the density of arrangement of the metal structure bodies.

INDUSTRIAL APPLICABILITY

The present invention enables photoelectric conversion even in infrared light, so that the present invention is applicable to a solar cell for performing energy conversion in a wide range of wavelengths of solar light with little loss. The present invention is also applicable to an optical sensor for use in an infrared CCD camera or the like operational at normal temperature to detect the infrared light electrically. In the case of applying the present invention to a solar cell, the present invention can be so embedded in a human body as to generate power semipermanently, and can be expected to be applied as in-plantable measurement equipment for monitoring health conditions of a body, for example.

REFERENCE SIGNS LIST

1, 101 Photoelectric conversion device, 2, 102 Substrate, 2a, 102a Surface, 2b, 102b Rear surface, 2c, 102c Adhesion layer, 3, 103 Metal microstructure bodies, 4, 104 Container, 5, 105 Counter electrode, 7, 107 Conductive layer, 8, 108 Electrical measuring equipment, I Incident light, L Electrolyte solution

The invention claimed is:

1. A photoelectric conversion device comprising:
a substrate containing single crystalline titanium dioxide;
adhesion layers that are thin metal films formed on a surface of the substrate;
metal structure bodies, each of which has a volume of 1,000 nm$^3$ or more and 3,000,000 nm$^3$ or less, adhering onto the substrate through the adhesion layers and arranged at predetermined intervals in a predetermined direction on surfaces of the adhesion layers;
a container for containing an electrolyte solution in an arrangement region of the metal structure bodies on the surface of the substrate;
a conductive layer formed on another surface of the substrate; and
a counter electrode in contact with the electrolyte solution in the container,
wherein a Schottky barrier is formed between the substrate and the metal structure bodies,
wherein photoelectric conversion is carried out for light in an infrared region by utilizing a plasmon resonance phenomenon, and
wherein the predetermined intervals are set independently of a size of the metal structure bodies.

2. The photoelectric conversion device according to claim 1, wherein
the counter electrode is a tabular transparent electrode provided so as to oppose the metal structure bodies on the surface of the substrate.

3. The photoelectric conversion device according to claim 1,
further comprising a reference electrode inserted into the electrolyte solution in the container.

4. The photoelectric conversion device according to claim 1, wherein
the metal structure bodies are two-dimensionally arranged on the surface in a first direction and in a second direction perpendicular to the first direction.

5. A photodetection device comprising:
a photoelectric conversion device according to claim 1; and
electrical measuring equipment connected to the conductive layer and the counter electrode.

6. A photodetection method comprising:
a step of irradiating with light a surface of a substrate containing single crystalline titanium dioxide in a state where an electrolyte solution is contained, the surface of the substrate having metal structure bodies, each of which has a volume of 1,000 nm$^3$ or more and 3,000,000 nm$^3$ or less, arranged thereon at predetermined intervals in a predetermined direction and adhered through adhesion layers that are thin metal films; and
a step of detecting photocurrent generated between a counter electrode in contact with the electrolyte solution and a conductive layer formed on another surface of the substrate,
wherein a Schottky barrier is formed between the substrate and the metal structure bodies,
wherein photoelectric conversion is carried out for light in an infrared region by utilizing a plasmon resonance phenomenon, and
wherein the predetermined intervals are set independently of a size of the metal structure bodies.

7. The photoelectric conversion device according to claim 1, wherein the predetermined intervals in the predetermined direction on surfaces of the adhesion layers are 75 nm or 175 nm or 275 nm.

8. The photoelectric conversion device according to claim 1, wherein the volume of each of the metal structure bodies is formed by an area of 100 nm$^2$ to 30,000 nm$^2$ and height of 10 nm to 100 nm.

* * * * *